United States Patent
Sadamitsu et al.

(10) Patent No.: US 6,277,193 B1
(45) Date of Patent: Aug. 21, 2001

(54) METHOD FOR MANUFACTURING SEMICONDUCTOR SILICON EPITAXIAL WAFER AND SEMICONDUCTOR DEVICE

(75) Inventors: Shinsuke Sadamitsu; Tooru Nagashima, both of Saga; Yasuo Koike, Kashima; Masaharu Ninomiya, Kishima-gun; Takeshi Kii, Fukudomi-machi, all of (JP)

(73) Assignee: Sumitomo Metal Industries, Ltd., Osaka (JP)

( * ) Notice: Subject to any disclaimer, the term of this patent is extended or adjusted under 35 U.S.C. 154(b) by 0 days.

(21) Appl. No.: 09/319,117

(22) PCT Filed: Dec. 2, 1997

(86) PCT No.: PCT/JP97/04386

§ 371 Date: Jun. 2, 1999

§ 102(e) Date: Jun. 2, 1999

(87) PCT Pub. No.: WO98/25299

PCT Pub. Date: Jun. 11, 1998

(30) Foreign Application Priority Data

Dec. 3, 1996 (JP) ...................................... 8-339024
Dec. 3, 1996 (JP) ...................................... 8-339025

(51) Int. Cl.$^7$ .............................................. C30B 25/04
(52) U.S. Cl. .................................. 117/88; 117/84; 117/89
(58) Field of Search ................................ 117/84, 88, 89

(56) References Cited

FOREIGN PATENT DOCUMENTS

| | | |
|---|---|---|
| 56-104799 | 8/1981 | (JP) . |
| 57-017125 | 1/1982 | (JP) . |
| 60-120516 | 6/1985 | (JP) . |
| 1-173727 | 7/1989 | (JP) . |
| 1-298726 | 12/1989 | (JP) . |

Primary Examiner—Felisa Hiteshew
(74) Attorney, Agent, or Firm—Breiner & Breiner

(57) ABSTRACT

A method for manufacturing semiconductor silicon epitaxial wafer and semiconductor device by which a gettering ability can be given to an epitaxial wafer in which the formation of BMD is not able to be expected in both low- and high-temperature device manufacturing processes, with the manufacturing processes being lower and higher than 1,050° C. in temperature, and has a specific resistance of $\geq 10$ m$\Omega$·cm. When this method is used, such BMD that is sufficient to obtain gettering can be formed in both the low- and high-temperature processes, with the manufacturing processes being lower and higher than 1,050° C. in temperature, even in the epitaxial wafer having a specific resistance of $\geq 10$ m$\Omega$·cm by performing low-temperature heat treatment at 650~900° C. before starting epitaxial film formation, by selecting the heat-treating time in accordance with the process temperature in the device manufacturing processes and heavy-metal contaminants which are mixed in during the device manufacturing processes can be gettered sufficiently. Therefore, the characteristic deterioration of a device can be prevented and the yield of the device can be improved.

8 Claims, 8 Drawing Sheets

METHOD FOR MANUFACTURING SEMICONDUCTOR SILICON EPITAXIAL WAFER AND SEMICONDUCTOR DEVICE

TECHNICAL FIELD

The present invention relates to a manufacturing method for granting gettering capabilities to a silicon epitaxial wafer used as a substrate for various semiconductor devices, and to a semiconductor silicon epitaxial wafer and semiconductor device manufacturing method, by which BMD (Bulk Micro Defect) required for gettering is formed in a wafer in a semiconductor device manufacturing process, which passes through a 1050° C. or lower temperature process flow, or a 1050° C. or higher temperature process flow in accordance with either performing a predetermined low-temperature heat treatment on a pulled silicon single-crystal ingot, or performing a predetermined low-temperature heat treatment prior to the formation of an epitaxial layer, enabling the demonstration of a sufficient IG (Intrinsic Gettering) effect, and enhanced device yield.

BACKGROUND ART

In a ULSI device manufacturing process, a variety of process flows are performed in accordance with the constitution of a device. For example, in a high-temperature heat treatment process or the like, heavy metal impurities, typified by Fe, Ni, Cu, can cause the formation of defects or an energy level near the surface of a wafer resulting in the degradation of device characteristics. These heavy metal impurities must therefore be removed from the vicinity of the wafer surface, and in order to achieve this, IG (Intrinsic Gettering) and various EG (Extrinsic Gettering) gettering techniques are used.

Generally, oxygen precipitate nuclei, which make impurity gettering possible, are scattered about in large numbers in a silicon single crystal grown using the Czochralski method or the magnetic Czochralski method (hereinafter referred to as the CZ method). These oxygen precipitate nuclei are introduced during the process of growing a silicon single crystal, and the higher the oxygen concentration, the more numerous the oxygen precipitate nuclei.

In a conventional high-temperature device process, having a Well Drive process, because oxygen precipitation occurs relatively easily during device process heat treatment, forming sufficient BMD for gettering in bulk, NIG (Natural IG), DZ(Denuded Zone)-IG gettering has come into widespread use.

In the device process of the future, it has become clear that manufacturers will promote low-temperature processes that strive for yet higher levels of integration, and make use of high energy ion implantation. In that case, the in-process formation of BMD is expected to become a problem because of the move to low-temperature processing.

Therefore, in a low-temperature process, it is difficult to achieve an adequate IG effect as with a high-temperature process. Further, it is believed that even with a low-temperature process, it will be hard to avoid heavy metal impurities from high energy ion implantation and other factors, making gettering technology imperative.

Meanwhile, higher integration levels require that quality be increased even further in the near surface region of the wafer. Since, unlike a CZ-Si wafer, there are absolutely no Grown-in defects in an epitaxial layer, an epitaxial wafer has extremely high quality surface integrity. But until now, the use of epitaxial wafers has been limited by cost factors.

However, due to the problem of Grown-in defects, there is an extremely high likelihood that epitaxial wafers will be utilized in earnest in even higher integration next-generation devices (64MB, 256MB DRAM era). And epitaxial wafers are viewed as being the most likely candidates for 12-inch wafers as well.

To date, DZ-IG processing has been widely used to enhance the quality of the ordinary CZ-Si wafer. With this approach, a two-stage high temperature and low temperature heat treatment is performed. First, oxygen near the surface of a wafer is diffused toward the outside, interstitial oxygen, which constitutes the nuclei of microdefects, is reduced, and a DZ(Denuded Zone) layer, in which there are no defects in the device active area, is formed by subjecting a wafer to high-temperature heat treatment at between around 1100° C. and 1200° C. Thereafter, oxygen precipitate nuclei are formed in the wafer bulk via low-temperature heat treatment at between 600° C. and 900° C. However, with DZ-IG processing, grown-in defects exist in the device active area.

If this wafer is subjected to a high-temperature device process, oxygen precipitate nuclei grow into oxygen precipitates in accordance with the high-temperature heat treatment of the process, and a sufficient IG effect is exhibited. But with DZ-IG processing, problems arise in a state-of-the-art device process, such as residual Grown-in defects in the device active area, and the lack of in-process growth of sufficient oxygen precipitates in low-temperature device processing.

If the oxygen precipitation behavior of p/p++, p/p+, p/p− epitaxial wafers is compared, in a p/p++ epitaxial wafer, that has a high concentration of B in the substrate (substrate resistivity <10 mΩ·cm), oxygen precipitation occurs extremely easily in accordance with the effect of the high concentration of B. As shown in FIG. 3, sufficient BMD for gettering are formed, and an adequate IG effect can be expected even in a low-temperature process, and even in a low oxygen concentration substrate ([Oi]=12×$10^{17}$ atoms/$cm^3$ old ASTM, hereinafter omitted) for an epitaxial wafer with a substrate resistivity of less than 6 mΩ·cm, and in a high oxygen concentration substrate ([Oi]=15×$10^{17}$ atoms/$cm^3$) for an epitaxial wafer with a substrate resistivity of between 8~10 mΩ·cm.

Furthermore, FIG. 3 shows the results of selectively etching (5 minute Wright Etch) a wafer, and measuring BMD density using an optical microscope after using 8-inch outside diameter, p(100)B-doped substrates with initial oxygen concentrations of 12×$10^{17}$ atoms/$cm^3$ and 15×$10^{17}$ atoms/$cm^3$ to prepare a variety of epitaxial wafers with different substrate resistivity, and subjecting these wafers to the pattern of low-temperature process heat simulation shown in FIG. 1.

Further, the results of comparing the oxygen precipitation behavior of an epitaxial wafer and a polished wafer in a high-temperature process flow are shown in FIG. 4. FIG. 4 shows the results of selectively etching (5 minute Wright Etch) a wafer, and using an optical microscope to measure BMD density after utilizing 8-inch outside diameter, p(100) B-doped substrates with two types of substrate resistivity, 10~20 mΩ·cm(p+) and 10Ω·cm(p−), to prepare mirror polished wafers with initial oxygen concentrations varying in the range of 11~17×$10^{17}$ atoms/$cm^3$, and epitaxial wafers, the epitaxial layers of which were grown on wafers from the same lot as the mirror polished wafers, and subjecting these wafers to the pattern of high-temperature process heat simulation shown in FIG. 2.

When a mirror polished wafer is subjected to a high-temperature device process, oxygen precipitate nuclei grow to become oxygen precipitates in accordance with the high temperature heat treatments in the process, exhibiting an adequate IG effect.

Conversely, with an epitaxial wafer having resistivity of 10 mΩ·cm or higher, oxygen precipitate nuclei shrink or disappear as a result of the high-temperature heat histories at epitaxial growth, and oxygen precipitation is apparently suppressed considerably compared to that of a mirror polished wafer. It became clear that little if any BMD is formed, and the IG effect cannot be expected with an epitaxial wafer having substrate resistivity of 10 mΩ·cm or higher in either a low-temperature process or a high-temperature process, even when a substrate with a fairly high oxygen concentration is utilized.

Methods for performing pre-epitaxial growth heat treatment in order to achieve a sufficient IG effect have already been studied. In H. Tsuya et al.: APPI. Phys. Lett. 36 (1980) 658, heat treatment conditions calling for temperatures of between 620° C. to 1150° C. for between 16 hours and 64 hours in an oxygen atmosphere were studied, and indicated that heat treatment at 820° C. for 16 hours is effective for gettering. However, the evaluation of BMD was performed after heat treatment at 1140° C. for 2 hours on the assumption of a high temperature process, and the effect of the low-temperature process was not clear. There was also the problem that a heat treatment time of 16 hours or more is extremely long.

Further, Japanese Patent Publication No. 4-56800 reports a 2-stage heat treatment method, wherein, prior to epitaxial growth, a hightemperature heat treatment (1000~1100° C.) is added following a low-temperature heat treatment (500~900° C.). But this is a low temperature + high temperature 2-step heat treatment, a high cost, long duration heat treatment, and slippage and contamination problems associated with high-temperature heat treatment must also be considered.

Japanese Patent Laid-open No. 8-97220 proposes a method, wherein, during the process in which the temperature is increased in the epitaxial growth process, either the rate of increase in a temperature range of from 800° C. to 1000° C. is less than 15° C./min, or an arbitrary temperature is maintained for between 5~100 minutes. With this method, there is a clear drop in epitaxial throughput, and this method is also problematic in that the current situation requires the low cost, stable manufacture of epitaxial wafers.

As described above, epitaxial wafers are viewed as prime candidates for use as next-generation device wafers, but in the past it was difficult to achieve a sufficient IG effect in an epitaxial wafer, especially a p-type (B-doped) wafer having a substrate resistivity of 10 mΩ·cm or higher, using a low-temperature device process, even when a substrate with a high oxygen concentration was used.

DISCLOSURE OF THE INVENTION

With the foregoing epitaxial wafer gettering (IG) problems in view, an object of the present invention is to provide a semiconductor silicon epitaxial wafer and semiconductor device manufacturing method, which can exhibit a sufficient gettering effect (IG), and enhance device yield in both a device manufacturing process according to a low-temperature process flow of under 1050° C., and a device manufacturing process according to a high-temperature process flow of over 1050° C.

Similarly, a further object of the present invention is to provide a semiconductor silicon epitaial wafer and semiconductor device manufacturing method, which simplifies processing as much as possible in order to reduce costs, and which can exhibit a sufficient gettering effect (IG), and enhance device yield even in a device manufacturing process, wherein the only processing is at the pulling of the silicon single crystal ingot using the CZ method, without the carrying out of any process that can be expected to produce a post-wafering EG effect in the wafer.

The inventors, having as an object a semiconductor silicon epitaxial wafer capable of demonstrating a sufficient gettering effect (IG) in both a low-temperature device manufacturing process of under 1050° C., as well as in a device manufacturing process according to a high-temperature process flow of over 1050° C., conducted various studies aimed at performing a variety of low-temperature heat treatments prior to growing an epitaxial layer. As a result, the inventors brought the present invention to completion based on the knowledge that if a low-temperature heat treatment of between 650° C. and 900° C. is performed prior to the growth of an epitaxial layer by selecting a heat treatment time in accordance with the processing temperature of a device manufacturing process, even in an epitaxial wafer with a resistivity of 10 mΩ·cm or higher, it is possible to achieve a sufficient gettering (IG) effect in both a low-temperature and a high-temperature device process having 1050° C. as the border temperature.

That is, the inventors discovered that sufficient BMD for gettering is formed in the heat treatment processes of a low-temperature device process, and a semiconductor silicon epitaxial wafer having sufficient IG capabilities can be achieved in a p-type (B-doped) CZ-Si wafer with a resistivity of 10 mΩ·cm or higher, in accordance with growing an epitaxial layer after annealing the wafer at between 650° C. and 900° C., preferably for 3 hours or longer, preferably in an oxygen or nitrogen atmosphere, or in a gas mixture thereof, prior to epitaxial layer growth.

Further, the inventors similarly discovered that sufficient BMD for gettering is formed in the heat treatment processes of a high-temperature device process, and a semiconductor silicon epitaxial wafer having a sufficient IG effect can be achieved, and device yield enhanced in accordance with growing an epitaxial layer after annealing the wafer at between 700° C. and 900° C., preferably for less than 3 hours in the above-described atmosphere prior to epitaxial layer growth.

Further, the inventors propose a semiconductor device manufacturing method, which applies to a semiconductor silicon epitaxial wafer a process flow that accords with the constitution of a device, this semiconductor device manufacturing method making possible the formation of sufficient BMD required for gettering, the demonstration of sufficient IG capabilities, and the enhancement of device yield in accordance with subjecting a sliced p-type (B-doped) CZ-Si wafer with a resistivity of 10 mΩ·cm or higher either to a heat treatment at a temperature of between 650° C. and 900° C., preferable for 3 hours or longer, or to a heat treatment at a temperature of between 700° C. and 900° C., preferable for less than 3 hours, and thereafter applying the above-mentioned 1050° C. or lower low-temperature process flow, or the above-mentioned 1050° C. or higher high-temperature process flow to a semiconductor silicon epitaxial wafer on which an epitaxial layer has been grown.

Furthermore, having as an object a semiconductor silicon epitaxial wafer capable of demonstrating a sufficient gettering effect (IG) in both a low-temperature device manufacturing process of under 1050° C., as well as in a device manufacturing process according to a high-temperature process flow of over 1050° C., the inventors conducted various studies aimed at granting gettering capabilities to an as-pulled silicon single crystal ingot itself. As a result, the inventors brought the present invention to completion based on the knowledge that if the same means as those described above can be applied to the heat treatment of a wafer, and a low-temperature heat treatment of between 650° C. and 900° C. is performed following the pulling of a silicon single crystal ingot using the CZ method by selecting a heat treatment time in accordance with the process temperature of a device manufacturing process, it is possible to achieve a sufficient gettering (IG) effect in both a low-temperature and a high-temperature device process having 1050° C. as the border temperature even in an epitaxial wafer with a resistivity of 10 mΩ·cm or higher on which an epitaxial layer has been grown, without performing a process that can be expected to produce an EG effect after the ingot has been sliced into silicon wafers.

Therefore, the present invention grants gettering capabilities that are not lost even under the influence of epitaxial layer growth heat hysteresis, by simply performing low-temperature heat treatment on a silicon single crystal ingot pulled using the CZ method by controlling the B concentration for achieving a p-type (B-doped) CZ-Si wafer with a resistivity of 10 mΩ·cm or higher, enabling the realization of a semiconductor silicon epitaxial wafer, in which sufficient BMD for gettering is formed in the annealing process of a device process, and which has sufficient IG capabilities for a variety of impurities, and enabling processing to be simplified by eliminating the need to perform any processing that could be expected to produce a post-wafering EG effect.

That is, the present invention is a semiconductor device manufacturing method, which applies to a semiconductor silicon epitaxial wafer a process flow that accords with the constitution of a device, this semiconductor device manufacturing method making possible the formation of sufficient BMD required for gettering, the demonstration of sufficient IG capabilities, and the enhancement of device yield in accordance with subjecting a silicon single crystal ingot, pulled using the CZ method by controlling the B concentration for achieving a p-type (B-doped) CZ-Si wafer with a resistivity of 10 mΩ·cm or higher, either to a heat treatment at a temperature of between 650° C. and 900° C. for 3 hours or longer, or to a heat treatment at a temperature of between 700° C. and 900° C., preferably for less than 3 hours, and thereafter, without performing a process that could be expected to produce a post-wafering EG effect, applying either the above-mentioned 1050° C. or lower low-temperature process flow, or the above-mentioned 1050° C. or higher high-temperature process flow to a semiconductor silicon epitaxial wafer, which has been mirror polished on either one side or two sides, and has had an epitaxial layer grown on a predetermined surface via a vapor phase growth method.

BEST MODE FOR CARRYING OUT THE INVENTION

Figure 1:
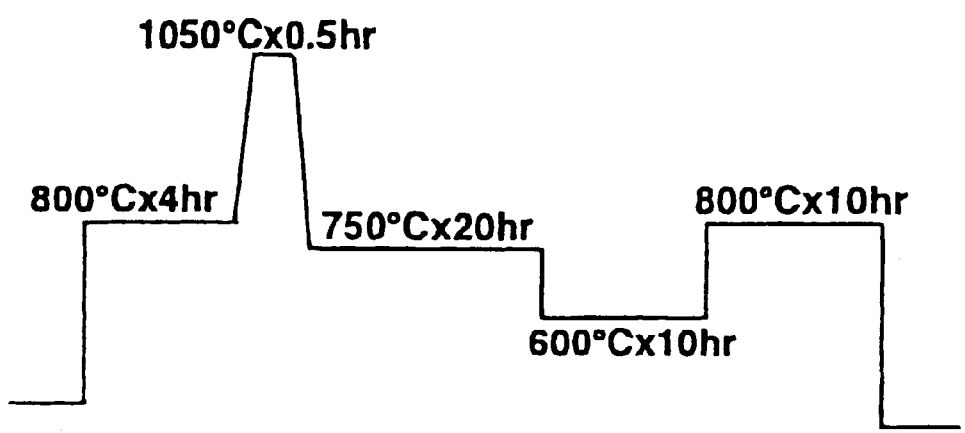
FIG. 1 is a graph showing a heat simulation pattern of a low-temperature process utilized in experiments of the present invention.
Figure 4:
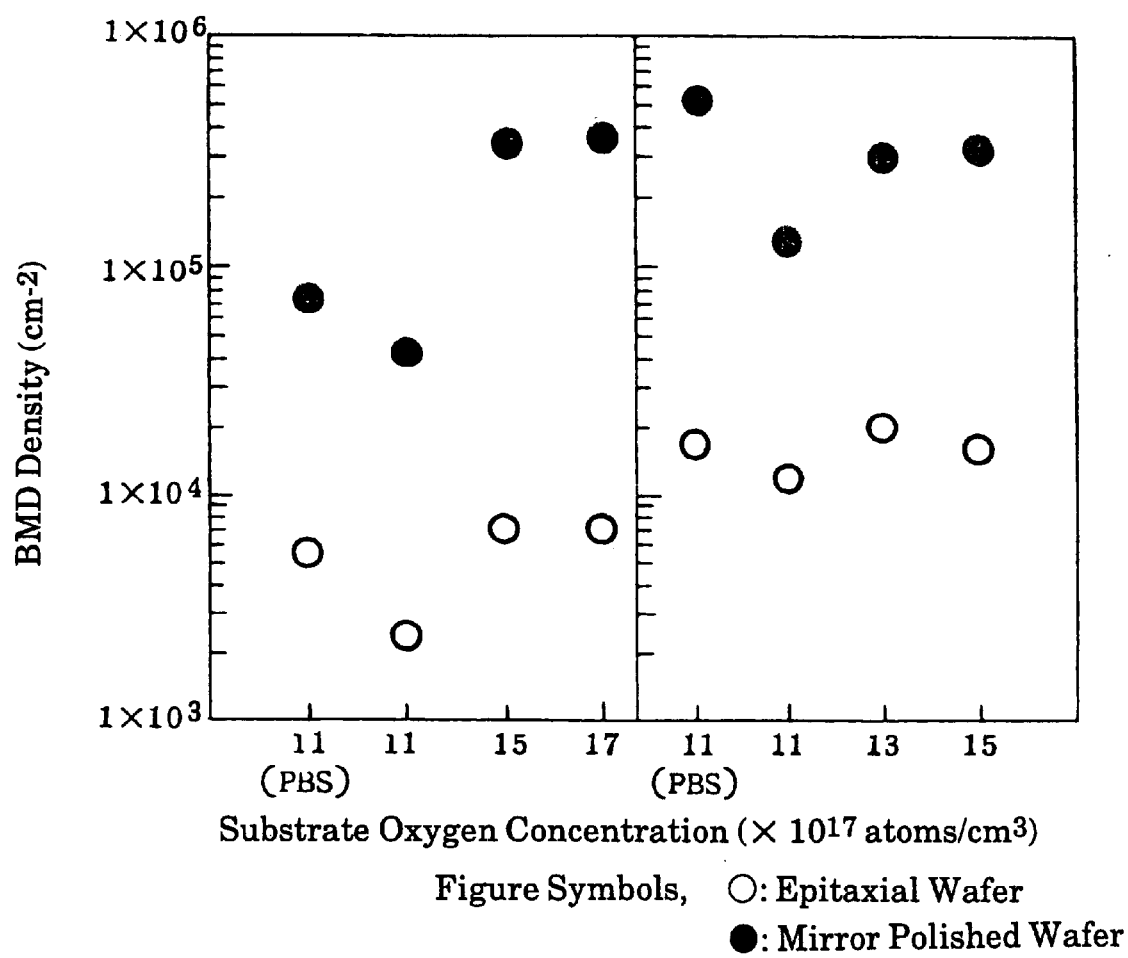
FIG. 4 is a graph of initial oxygen concentrations and BMD densities, showing the results of preparing mirror polished wafers from 8-inch p(100)B-doped CZ-Si substrates with two types of substrate resistivity, 10~20 mΩ·cm (p+) and 10Ω·cm(p−), and different initial oxygen concentrations, and epitaxial wafers, which had 3 μm thick epitaxial layers grown on wafers from the same lot as the mirror polished wafers, and subjecting these wafers to the high-temperature process heat simulation of FIG. 2, following which the wafers were selectively etched (5 minute Wright Etch), and BMD density was measured using an optical microscope.

As for the present invention, the inventors performed a variety of heat treatments on a p-type CZ-Si wafer prior to epitaxial growth, then grew an epitaaial layer, subjected the epitaxial wafer to low-temperature process heat simulation of the pattern shown in FIG. 1, and studied BMD generation behavior. As a result, the inventors clarified that a sufficient gettering (IG) effect can be achieved in a low-temperature device process as well, even with an epitaxial wafer having a resistivity of 10 mΩ·cm or higher, if pre-epitaxial growth low-temperature heat treatment is performed using conditions of between 650° C. and 900° C., preferably for 3 hours or longer. The inventors also studied BMD generation behavior after subjecting an epitaxial wafer to the high-temperature process flow heat simulation of the pattern shown in FIG. 2 (See FIG. 4). As a result, the inventors clarified that a sufficient gettering (IG) effect can be achieved in a high-temperature device process even in an epitaxial wafer having a resistivity of 10 mΩ·cm or higher, if pre-epitaxial growth low-temperature heat treatment is performed using conditions of between 700° C. and 900° C., preferably for less than 3 hours.

The present invention is characterized in that a 1-step low-temperature wafer heat treatment is performed prior to an epitaxial growth process, and it is a novel invention, which enables low-cost, volume wafer processing, is capable of being applied to either a low-temperature process or a high-temperature process, and differs from all the above-mentioned conventional processing methods as to substrate oxygen concentration, and resistivity, and heat treatment temperature, time, and atmosphere.

Further, the inventors performed a variety of low-temperature heat treatments on a silicon single crystal ingot pulled using a CZ method by controlling the concentration of B, following which they sliced, mirror polished, and grew an epitaxial layer on the p-type CZ-Si wafers, subjected the epitaxial wafers to low-temperature process heat simulation of the pattern shown in FIG. 1, and studied BMD generation behavior. As a result, the inventors confirmed that a sufficient gettering (IG) effect can be achieved in a low-temperature device process as well, even with an epitaxial wafer having a resistivity of 10 mΩ·cm or higher, without performing a process that can be expected to produce a post-wafering EG effect, if low-temperature heat treatment is performed on a pulled ingot using conditions of between 650° C. and 900° C., preferably for 3 hours or longer. The inventors also studied BMD generation behavior after subjecting an epitaxial wafer to high-temperature process flow heat simulation of the pattern shown in FIG. 2 (See FIG. 6). As a result, the inventors confirmed that a sufficient gettering (IG) effect can similarly be achieved with a high-temperature device process, even in an epitaxial wafer having a resistivity of 10 mΩ·cm or higher, if low-temperature heat treatment is performed on a pulled ingot using conditions of between 700° C. and 900° C., preferably for less than 3 hours. That is, the inventors confirmed that all the embodiments, such as the below-described heat treatment conditions for a wafer, are the same as the heat treatment for a single crystal ingot.

In the present invention, the reason that substrate resistivity is made 10 mΩ·cm or higher is because, at less than 10 mΩ·cm, as already explained, oxygen precipitation is abnormally accelerated by the effect of a high concentration of B, and because gettering-sufficient BMD, which is not affected by the heat histories at epitaxial deposition, is formed at an extremely early stage of a low-temperature process without pre-epitaxial growth heat treatment. In a 10 mΩ·cm or higher substrate, since oxygen precipitation is significantly suppressed by the heat histories during epitaxial growth, pre-epitaxial growth heat treatment in accordance with the present invention is essential for achieving sufficient BMD.

Figure 5:
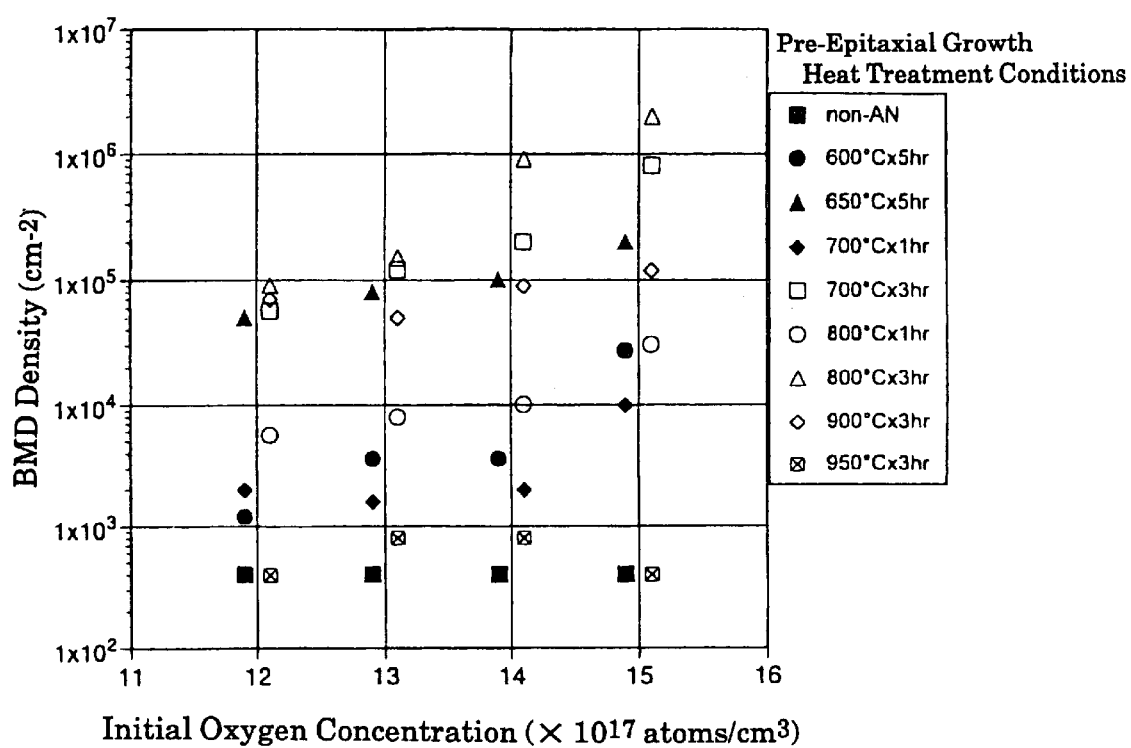
FIG. 5 is a graph of initial oxygen concentrations and BMD densities, showing the results of applying various 6-inch substrate wafers with different initial oxygen concentrations to a variety of heat treatments, manufacturing epitaxial wafers, and thereafter subjecting these wafers to the low-temperature process heat simulation of FIG. 1, after which the wafers were selectively etched, and BMD density was measured using an optical microscope.

In the present invention, with regard to the oxygen concentration of a substrate, $12\times10^{17}$ atoms/cm$^3$ or more is desirable. An oxygen concentration lower than $12\times10^{17}$ atoms/cm$^3$ does not achieve sufficient BMD at heat treatment conditions of between 650° C. and 900° C. for 3 hours or longer. As shown in FIG. 5, sufficient BMD was observed in a substrate of $12\times10^{17}$ atoms/cm$^3$ or more following low-temperature process heat simulation of the pattern shown in FIG. 1.

In the present invention, the heat treatment temperature applied to a wafer slated for low-temperature processing is set at between 650° C. and 900° C. because at less than 650° C., although oxygen precipitate nuclei are grown to sizes that will not shrink under the high-temperature heat histories during the growth of an epitaxial layer, these temperatures are not desirable because of the long heat treatment time required. When the heat treatment temperature exceeds 900° C., the temperature is too hot, oxygen precipitate nuclei of sufficient density are not grown, and the effect thereof is not achieved.

It is desirable that the heat treatment temperature applied to a wafer slated for low-temperature processing be applied for more than 3 hours at the above-described temperature conditions to achieve BMD of sufficient density, $5\times10^4$ defects/cm$^2$ or higher, for gettering even in a low-temperature process.

In the present invention, the heat treatment temperature applied to a wafer slated for high-temperature processing is set at between 700° C. and 900° C. because at under 700° C., although oxygen precipitate nuclei are grown to sizes that will not shrink under the high-temperature heat histories of epitaxial layer growth, these temperatures are not desirable because of the long heat treatment time required. When the heat treatment temperature exceeds 900° C., the temperature is too hot, oxygen precipitate nuclei of sufficient density are not grown, and the effect thereof is not achieved.

The heat treatment temperature applied to a wafer slated for high-temperature processing is applied for less than 3 hours even in a 700° C. heat treatment, and is set at less than 3 hours to achieve BMD of sufficient density (>$5\times10^4$ defects/cm$^2$) for gettering.

Furthermore, in an epitaxial wafer, in which BMD of $5\times10^5$ defects/cm$^2$ or higher had been generated in the heat simulation of a high-temperature process flow, slippage dislocation caused by excess oxygen precipitation was observed in the center portion of the wafer following heat simulation. This slippage dislocation is known to adversely affect device characteristics. Therefore, due to the problem of in-process slippage dislocation generation, it has become clear that, in the case of a high-temperature device process, it is necessary to make BMD density less than $5\times10^5$ defects/cm$^2$, and more preferably, less than $1\times10^5$ defects/cm$^2$.

Figure 8:
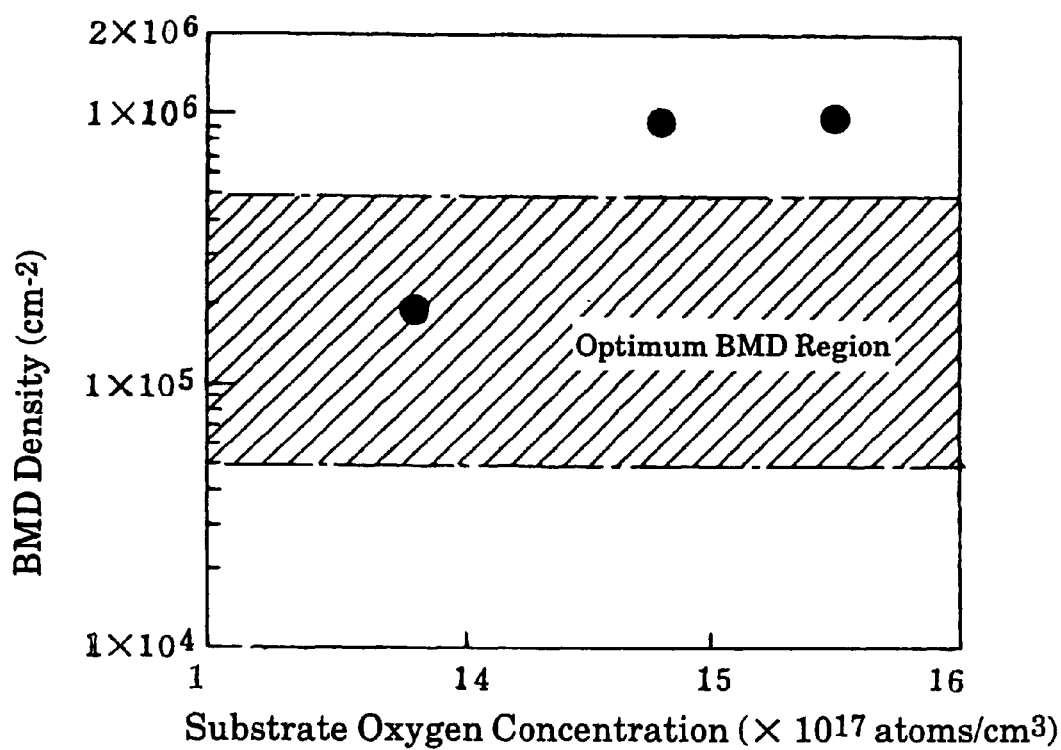
FIG. 8 is a graph of initial oxygen concentrations and BMD densities, showing the results of subjecting wafers from 8-inch p(100) B-doped (resistivity of 10Ω·cm) CZ-Si substrates with different initial oxygen concentrations to heat treatment at 800° C. for 2 hours, and thereafter, manufacturing epitaxial wafers by growing thereon 3 μm thick epitaxial layers, subjecting these epitaxial wafers to the high-temperature process flow heat simulation of FIG. 2, selectively etching (5 minute Wright etch) the wafers, and measuring BMD using an optical microscope.

Even when heat treatment time was less than 3 hours, with a substrate having an oxygen concentration of $15\times10^{17}$ atoms/cm$^3$ (old ASTM), more than $5\times10^5$ defects/cm$^2$ of BMD was formed following heat simulation of wafers that were subjected to pre-epitaxial growth low-temperature heat treatments at 800° C. for 2 hours and 3 hours, and slippage dislocation was also observed in the center portion of the wafers. But, in this case, BMD density can be optimized by adjusting the oxygen concentration of the substrate, and as shown in FIG. 8, it was confirmed that the optimum BMD density can be achieved, and the generation of slippage dislocation prevented by reducing the substrate oxygen concentration. The desirable substrate oxygen concentration is $10\sim15\times10^{17}$ atoms/cm$^3$ (old ASTM).

As for the atmosphere, in an oxygen atmosphere at a temperature of 1000° C., the injection of an interstitial silicon atom into the bulk occurs in line with the formation of a surface oxide film, and oxygen precipitation is suppressed more than in a non-oxidizing atmosphere. But at under 900° C., the growth of an oxide film does not occur much, even in an oxygen atmosphere, and no difference in effect was observed between an oxygen atmosphere and a nitrogen atmosphere. Further, in heat treatments in accordance with the present invention, it was ascertained that neither low-temperature process heat simulation nor high-temperature process flow heat simulation had any affect on oxide film reliability or other quality factors related to an epitaxial wafer, making an atmosphere of oxygen, or nitrogen, or a gas mixture thereof desirable.

EMBODIMENTS

Embodiment 1

Six-inch outer diameter, p(100) B-doped (10 mΩ·cm resistivity) Cz-Si wafers, having initial oxygen concentrations of $12\times10^{17}$ atoms/cm$^3$, $13\times10^{17}$ atoms/cm$^3$, $14\times10^{17}$ atoms/cm$^3$, and $15\times10^{17}$ atoms/cm$^3$ (old ASTM) were prepared, heat treatments of 600° C.×5 hr., 650° C.×5 hr., 700° C.×1 hr., 700° C.×3 hr., 800° C.×1 hr., 800° C.×3 hr., 900° C.×3 hr., and 950° C.×3 hr. were applied to these wafers in a nitrogen atmosphere prior to epitaxial layer growth, then these wafers, including wafers that had not undergone heat treatment, were set inside a single wafer-type CVD reactor at 850° C., the temperature was increased at a rate of 150° C./minute to 1150° C., and following etching with HCl, a 3 μm-thick epitaxial layer with a resistivity of 10Ω·cm was grown at 1050° C. using SiHCl$_3$ gas, to produce epitaxial wafers.

These epitaxial wafers were subjected to low-temperature process heat simulation of the pattern shown in FIG. 1, and thereafter selectively etched (5 minute Wright Etch), and BMD measured using an optical microscope. The results thereof are shown in FIG. 5.

As shown in FIG. 5, heat treatment at 600° C. for 5 hours, and at 950° C. for 3 hours did not achieve sufficient BMD, but BMD of $5\times10^4$ defects/cm$^2$ or higher, which is sufficient for gettering, was observed in those wafers that underwent pre-epitaxial growth heat treatment at 650° C. for 5 hours, and at 700° C., 800° C., and 900° C. for 3 hours in a low-temperature process heat simulation of the pattern shown in FIG. 1.

Figure 7:
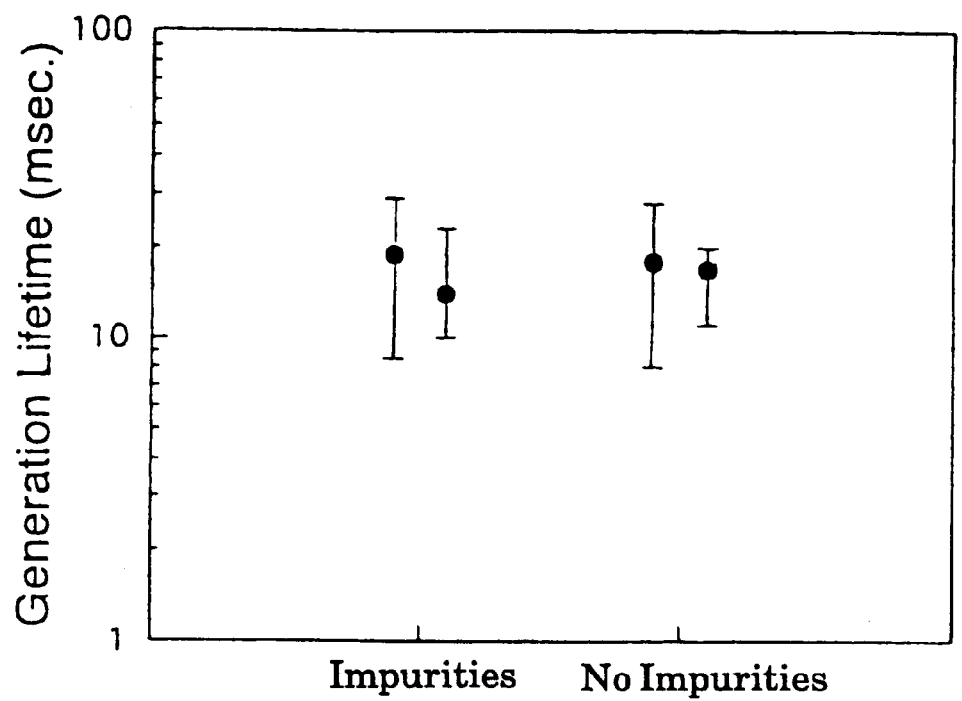
FIG. 7 is a graph showing the results of applying a low-temperature process heat treatment to an embodiment, and thereafter measuring the generation lifetime in accordance with the MOS-Ct method.

Further, epitaxial wafers with an initial oxygen concentration of $15\times10^{17}$ atoms/cm$^3$, which had been subjected to pre-epitaxial growth heat treatment in a nitrogen atmosphere at 800° C. for 3 hours, were actually contaminated on purpose with Ni ($1\times10^{12}$ atoms/cm$^2$), following which they were subjected to the same low-temperature process heat simulation. After simulation, generation lifetime measurements were performed in accordance with the MOS-Ct method. The results thereof are shown in FIG. 7.

Generation lifetime was good, with no apparent difference between purposely contaminated and uncontaminated wafers, and in wafers that had been subjected to appropriate pre-epitaxial growth heat treatment, a sufficient gettering effect was confirmed in the low-temperature process.

Embodiment 2

Eight-inch outer diameter, p(100) B-doped (10Ω·cm resistivity) Cz-Si wafers, having an initial oxygen concentration of $15\times10^{17}$ atoms/cm$^3$ (old ASTh), were prepared, and heat treatments of 1) 650° C.×3 hr., 650° C.×5 hr.,
2) 700° C.×1 hr., 700° C.×3 hr., 700° C.×5 hr.,
3) 750° C.×1 hr., 750° C.×2 hr., 750° C.×3 hr., 750° C.×5 hr.,
4) 800° C.×0.5 hr., 800° C.×1 hr., 800° C.×2 hr., 800° C.×3 hr., 800° C.×5 hr.,
5) 850° C.×0.5 hr., 850° C.×1 hr., 850° C.×2 hr., 850° C.×3 hr., 850° C.×5 hr.,
6) 900° C.×0.5 hr., 900° C.×3 hr., 900° C.×5 hr.,
7) 950° C.×0.5 hr., 950° C.×3 hr., 950° C.×5 hr.

were applied to these wafers in a nitrogen atmosphere prior to epitaxial layer growth, then these wafers were set inside a single wafer-type CVD reactor at 850° C., the temperature was increased at a rate of 150° C./minute to 1150° C., and following etching with HCl, a 3 μm-thick epitaxial layer with a resistivity of 10Ω·cm was grown at 1050° C. using SiHCl$_3$ gas, producing epitaxial wafers.

Figure 2:
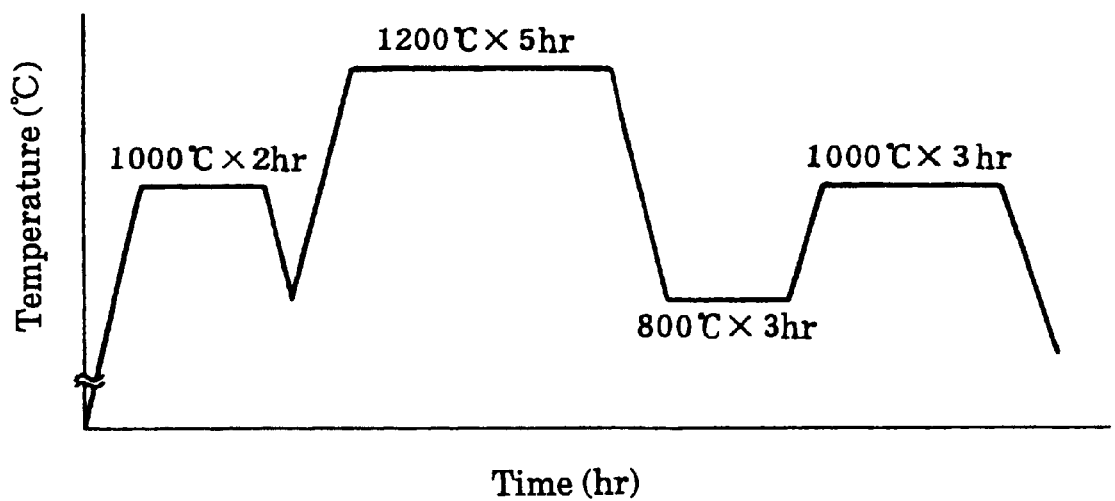
FIG. 2 is a graph showing a heat simulation pattern of a high-temperature process, which is a semiconductor device process utilized in the experiments.
Figure 3:
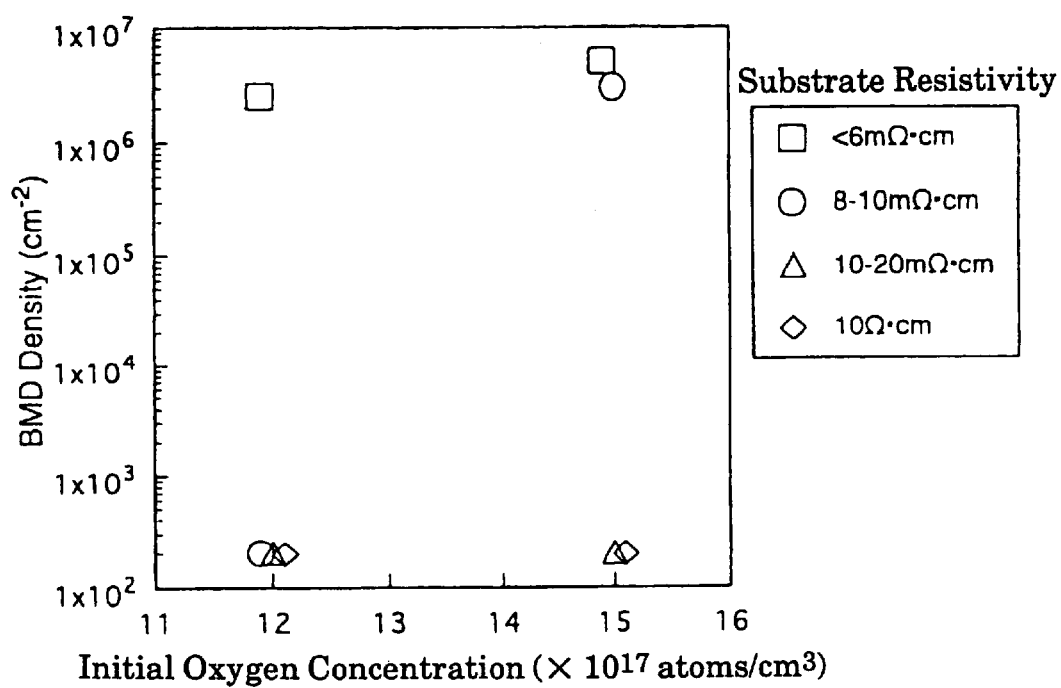
FIG. 3 is a graph of initial oxygen concentrations and BMD densities, showing the results of applying the low-temperature process heat simulation of FIG. 1 to a variety of 8-inch substrate epitaxial wafers, having different initial oxygen concentrations and resistivity, following which the wafers were selectively etched and BMD density was measured using an optical microscope.

These epitaxial wafers were subjected to high-temperature process flow heat simulation of the pattern shown in FIG. 2, and thereafter selectively etched (5 minute Wright Etch), and BMD measured using an optical microscope. The results thereof are shown in FIG. 6.

Figure 6:
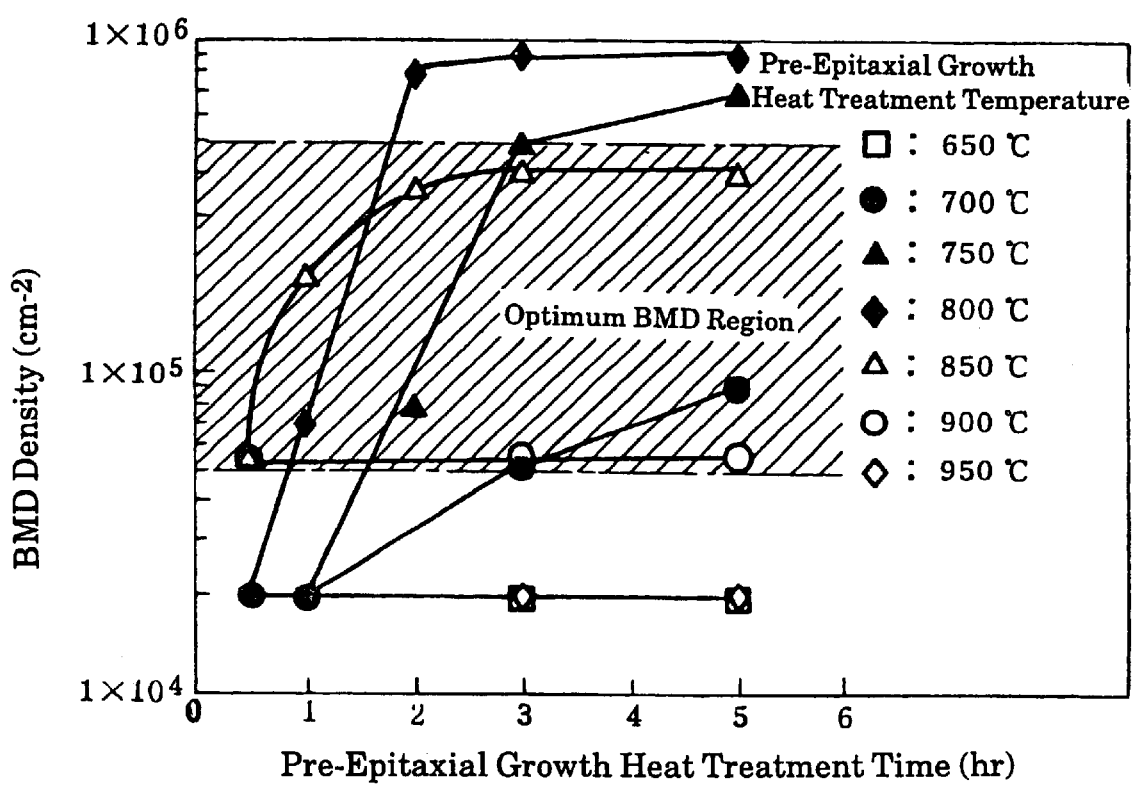
FIG. 6 is a graph of BMD densities and pre-epitaxial growth heat treatment times under a variety of conditions, showing the results of subjecting wafers from 8-inch p(100) B-doped CZ-Si substrates with an initial oxygen concentration of 15×10$^{17}$ atoms/cm$^3$ (old ASTM) to low-temperature heat treatments under a variety of conditions in a nitrogen atmosphere prior to epitaxial growth, then manufacturing epitaxial wafers by growing thereon 3 μm thick epitaxial layers, and thereafter, subjecting these wafers to the high-temperature process heat simulation of FIG. 2, selectively etching the wafers (5 minute Wright Etch), and using an optical microscope to measure BMD density.

As shown in FIG. 6, pre-epitaxial growth heat treatment at 650° C. and at 950° C. for 5 hours did not achieve sufficient BMD, but BMD of $5\times10^4$ defects/cm$^2$ or higher, which is sufficient for gettering (IG), was observed in those wafers that underwent pre-epitaxial growth heat treatment at 700° C., 750° C., 800° C., 850° C., and 900° C. for 3 hours in a semiconductor device process high-temperature process flow heat simulation of the pattern shown in FIG. 2. However, BMD of $5\times10^5$ defects/cm$^2$ or higher was observed in wafers that had undergone pre-epitaxial growth heat treatment at 800° C. for 2 hours and 3 hours, and excess precipitation-caused dislocations were observed in the center portion of wafers. The optimum region for BMD which is sufficient for gettering (IG), and which does not generate dislocations is $5\times10^4$~$5\times10^5$ defects/cm$^2$.

Embodiment 3

Next, 8-inch outer diameter, p(100) B-doped (10Ω·cm resistivity) Cz-Si wafers, having an initial oxygen concentration in the range of 13~$16\times10^{17}$ atoms/cm$^3$ (old ASTM), were prepared, and heat treatments at 800° C.×2 hr. were applied to these wafers in a nitrogen atmosphere prior to an epitaxial layer growth process, then these wafers were set inside a single wafer-type CVD reactor at 850° C., the temperature was increased at a rate of 150° C./minute to 1150° C., and following etching with HCl, a 3 μm-thick epitaxial layer with a resistivity of 10Ω·cm was grown at 1050° C. using SiHCl$_3$ gas, producing epitaxial wafers.

These epitaxial wafers were subjected to high-temperature process flow heat simulation of the pattern shown in FIG. 2, and thereafter selectively etched (5 minute Wright Etch), and BMD measured using an optical microscope. The results thereof are shown in FIG. 8.

As shown in FIG. 8, with pre-epitaxial growth heat treatment at 800° C. for 2 hours, the BMD density of CZ-Si wafers having an initial oxygen concentration of $13.8\times10^{17}$ atoms/cm$^3$ (old ASTM) were within the optimum BMD region, and it was ascertained that no dislocations had been generated. However, with CZ-i wafers having an initial oxygen concentration of $13.8\times10^{17}$ atoms/cm$^3$ (old ASTM), high density BMD was generated, and slippage dislocations resulting from excess precipitation were observed, similar to the results of FIG. 6. Therefore, when BMD density exceeds the upper limit in accordance with heat treatment within the scope of the present invention, it is possible to form BMD of an appropriate density by optimizing the initial oxygen concentration.

INDUSTRIAL APPLICABILITY

The present invention grants gettering capabilities to a 10 mΩ·cm or higher resistivity, p-type (Bdoped) CDSi wafer, which cannot be expected to produce a sufficient gettering effect (IG) in either a low-temperature device process or a high-temperature device process, and in accordance with applying a predetermined low-temperature heat treatment to an ingot pulled using the CZ method, or in accordance with applying a suitable heat treatment prior to growing an epitaxial layer by selecting a heat treatment time according to the processing temperature of a device manufacturing process, enables the generation of sufficient BMD in both a low-temperature device process and a high-temperature device process, and makes possible sufficient gettering even when heavy metal impurities occur in the process. Further, in accordance with the heat treatment conditions of the present invention, it is possible to prevent the generation of in-process slippage dislocations resulting from excess oxygen precipitation.

Further, due to flatness problems, the specifications of next-generation 12-inch wafers are expected to call for a mirror-polished finish on both sides, and to grant PBS (Poly-Si Back Seal) or BSD (Back Side Damage) EG (Extrinsic Gettering) to the backside of a wafer will require a complex manufacturing process. However, the present invention makes possible the use of a simple process to grant sufficient gettering effect (IG effect) to an epitaxial wafer even when it is mirror polished on both sides.

Further, since a 1-step low-temperature heat treatment is sufficient to ensure via an epitaxial layer the near-surface integrity of a device active layer, there is no need for a high-temperature heat treatment, enabling heat treatment to be performed at a lower cost than the DZ-IG processing performed on ordinary CZ-Si wafers to date. For example, in the above-described processing performed in an epitaxial reactor during an epitaxial process (Japanese Patent Laid-open No. 8-97220), volume processing is difficult, but since the method in accordance with the present invention is carried out using an ordinary annealing furnace, it is advantageous in that a large volume of wafers can be processed at one time, and the throughput of the epitaxial growth process itself is completely unaffected.

What is claimed is:

1. A semiconductor silicon epitaxial wafer manufacturing method, comprising applying a heat treatment at a temperature of between 650° C. and 900° C. in either an oxygen or nitrogen atmosphere or a mixed gas atmosphere thereof, to a 10 mΩ·cm or higher substrate resistivity wherein the oxygen concentration is 10~less than $14.4 \times 10^{17}$ atoms/cm$^3$ (old ASTM); and p-type (B-doped) CZ-Si wafer, BMD nuclei capable of generating BMD of $5 \times 10^4$ defects/cm$^2$~$5 \times 10^5$ defects/cm$^2$ are formed in a 1050° C. or lower temperature device manufacturing process, after which, the wafer is mirror polished on either one side or two sides, and an epitaxial layer is grown on a surface using a vapor-phase growth method.

2. A semiconductor silicon epitaxial wafer manufacturing method, comprising applying a heat treatment at a temperature of between 700° C. and 900° C. in either an oxygen or nitrogen atmosphere or a mixed gas atmosphere thereof, to a 10 mΩ·cm or higher substrate resistivity wherein the oxygen concentration is 10~less than $14.4 \times 10^{17}$ atoms/cm$^3$ (old ASTM); and p-type (B-doped) CZ-Si wafer, BMD nuclei capable of generating BMD of $5 \times 10^4$ defects/cm$^2$~$5 \times 10^5$ defects/cm$^2$ are formed in a 1050° C. or higher temperature device manufacturing process, after which, the wafer is mirror polished on either one side or two sides, and an epitaxial layer is grown on a surface using a vapor-phase growth method.

3. A semiconductor silicon epitaxial wafer manufacturing method, comprising applying a heat treatment at a temperature of between 650° C. and 900° C. to a silicon single crystal ingot pulled and removed via the CZ method by controlling the concentration of B so as to obtain a 10 mΩ· or higher resistivity, p-type (B-doped) CZ-Si wafer, and without performing a process that would produce an EG effect after the ingot has been sliced into silicon wafers, BMD nuclei capable of forming BMD sufficient for gettering are formed in a 1050° C. or lower temperature device manufacturing process, the wafer is mirror polished on either one side or two sides, and an epitaxial layer is grown on a surface using a vapor-phase growth method.

4. The semiconductor silicon epitaxial wafer manufacturing method of claim 3 wherein the BMD density generated by the device manufacturing process is $5 \times 10^4$ defects/cm$^2$~$5 \times 10^5$ defects/cm$^2$.

5. The semiconductor silicon epitaxial wafer manufacturing method according to claim 3, wherein the oxygen concentration of the ingot is $10~15 \times 10^{17}$ atoms/cm$^3$ (old ASTM).

6. A semiconductor silicon epitaxial wafer manufacturing method, comprising applying a heat treatment at a temperature of between 700° C. and 900° C. to a silicon single crystal ingot pulled and removed via the CZ method by controlling the concentration of B so as to obtain 10 mΩ·cm or higher resistivity, p-type (B-doped) CZ-Si wafer, and without performing a process that would produce an EG effect after slicing the ingot into silicon wafers, BMD nuclei capable of forming BMD sufficient for gettering are formed in a 1050° C. or higher temperature device manufacturing process, the wafer is mirror polished on either one side or two sides, and an epitaxial layer is grown on a surface using a vapor-phase growth method.

7. The semiconductor silicon epitaxial wafer manufacturing method of claim 6 wherein the BMD density generated by the device manufacturing process is $5 \times 10^4$ defects/cm$^2$~$5 \times 10^5$ defects/cm$^2$.

8. semiconductor silicon epitaxial wafer manufacturing method according to claim 6, wherein the concentration of the ingot is $10~15 \times 10^{17}$ atoms/cm$^3$ (old ASTM).

* * * * *

UNITED STATES PATENT AND TRADEMARK OFFICE
CERTIFICATE OF CORRECTION

PATENT NO.    : 6,277,193 B1
DATED         : August 21, 2001
INVENTOR(S)   : Shinsuke Sadamitsu et al.

It is certified that error appears in the above-identified patent and that said Letters Patent is hereby corrected as shown below:

Column 2,
Line 12, "microdefects" should read -- micro-defects --.

Column 3,
Line 30, "hightemperature" should read -- high temperature --.

Column 6,
Line 56, "epitaaial" should read -- epitaxial --.

Column 10,
Line 20, "$800^{20\ c.,}$" should read -- 800°C. --.
Line 66, "CDSi" should read -- CZ-Si --.

Column 12,
Line 50, insert -- The -- before "semiconductor".
Line 51, insert -- oxygen -- before "concentration".

Signed and Sealed this

Sixth Day of August, 2002

Attest:

JAMES E. ROGAN
Attesting Officer    Director of the United States Patent and Trademark Office